(12) United States Patent
Lim

(10) Patent No.: US 11,094,777 B2
(45) Date of Patent: Aug. 17, 2021

(54) FUNCTIONAL CONTACTOR

(71) Applicant: AMOTECH CO., LTD., Incheon (KR)

(72) Inventor: Byung Guk Lim, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 103 days.

(21) Appl. No.: 16/346,970

(22) PCT Filed: Nov. 2, 2017

(86) PCT No.: PCT/KR2017/012302
§ 371 (c)(1),
(2) Date: May 2, 2019

(87) PCT Pub. No.: WO2018/084586
PCT Pub. Date: May 11, 2018

(65) Prior Publication Data
US 2020/0066835 A1 Feb. 27, 2020

(30) Foreign Application Priority Data

Nov. 4, 2016 (KR) .......... 10-2016-0146489
Nov. 4, 2016 (KR) .......... 10-2016-0146491

(51) Int. Cl.
*H01L 29/02* (2006.01)
*H01L 49/02* (2006.01)
(Continued)

(52) U.S. Cl.
CPC ............. *H01L 28/60* (2013.01); *H01C 7/112* (2013.01); *H01C 7/118* (2013.01); *H01R 12/70* (2013.01);
(Continued)

(58) Field of Classification Search
CPC ......... H01L 28/60; H01C 7/112; H01C 7/118; H01R 12/70; H05K 1/0259; H05K 9/0016; H05K 9/0067
See application file for complete search history.

(56) References Cited

U.S. PATENT DOCUMENTS 6,359,215 B1 * 3/2002 Horng .................. H05K 9/0016
174/367
6,489,555 B1 * 12/2002 Horng .................. H05K 9/0016
174/361
(Continued)

FOREIGN PATENT DOCUMENTS

KR    2005-0028748    3/2005
KR    2007-0109332    11/2007
(Continued)

OTHER PUBLICATIONS

International Search Report and Written Opinion issued in International Patent Application No. PCT/KR2017/012302, dated Mar. 7, 2018.
(Continued)

*Primary Examiner* — Peter Bradford
(74) *Attorney, Agent, or Firm* — Norton Rose Fulbright US LLP

(57) ABSTRACT

A functional contactor is provided. The functional contactor according to one embodiment of the present invention comprises: a conductive elastic portion having elasticity and electrically contacting one of a circuit board of an electronic device, a bracket coupled to the circuit board, and a conductor which can come into contact with the human body; a substrate made from a dielectric material and having a groove in either the upper surface or the lower surface thereof; and a functional element comprising a high dielectric material inserted into the groove and made from sintered ceramic having a higher dielectric constant than a dielectric (Continued)

material, a first electrode disposed on the upper surface of the substrate and electrically connected in series to the conductive elastic portion, and a second electrode disposed on the lower surface of the substrate and opposite to the first electrode.

15 Claims, 11 Drawing Sheets

(51) Int. Cl.
*H01C 7/112* (2006.01)
*H01C 7/118* (2006.01)
*H01R 12/70* (2011.01)
*H05K 1/02* (2006.01)
*H05K 9/00* (2006.01)

(52) U.S. Cl.
CPC ......... *H05K 1/0259* (2013.01); *H05K 9/0016* (2013.01); *H05K 9/0067* (2013.01)

(56) References Cited

U.S. PATENT DOCUMENTS

| | | | |
|---|---|---|---|
| 6,538,197 | B1 | 3/2003 | Kawai |
| 10,716,196 | B2* | 7/2020 | Cho .......................... H01G 2/14 |
| 2012/0217050 | A1* | 8/2012 | Kurita .................... H01R 12/57 |
| | | | 174/261 |
| 2012/0319159 | A1* | 12/2012 | Nakatani ............... H01L 25/167 |
| | | | 257/99 |
| 2013/0122683 | A1 | 5/2013 | Malhotra et al. |
| 2014/0240878 | A1 | 8/2014 | Otsubo |
| 2015/0222035 | A1* | 8/2015 | Kurita .................. H05K 9/0016 |
| | | | 439/876 |
| 2017/0005464 | A1* | 1/2017 | Hwang .................... H01C 7/12 |
| 2019/0190167 | A1* | 6/2019 | Choi ...................... H01R 4/027 |

FOREIGN PATENT DOCUMENTS

| | | |
|---|---|---|
| KR | 2008-0031183 | 4/2008 |
| KR | 2010-0011834 | 2/2010 |
| KR | 2010-0101225 | 9/2010 |
| KR | 2010-0139075 | 12/2010 |
| KR | 10-1334237 | 11/2013 |
| KR | 10-1585604 | 1/2016 |
| KR | 2016-0093563 | 8/2016 |

OTHER PUBLICATIONS

International Search Report issued in International Patent Application No. PCT/KR2017/012303, dated Mar. 6, 2018.
International Search Report and Written Opinion issued in International Patent Application No. PCT/KR2017/012456, dated Mar. 22, 2018.

* cited by examiner

FUNCTIONAL CONTACTOR

CROSS-REFERENCE TO RELATED APPLICATIONS

This application is a national phase application under 35 U.S.C. § 371 of International Application No. PCT/KR2017/012302, filed Nov. 2, 2017, which claims priority to and the benefit of Korean Patent Applications No. 10-2016-0146491, filed Nov. 4, 2016, and No. 10-2016-0146489, filed Nov. 4, 2016. The contents of the referenced patent applications are incorporated into the present application by reference.

FIELD OF THE DISCLOSURE

The present invention relates to a contactor for an electronic device such as a smart phone, and more particularly, to a functional contactor which is capable of being easily manufactured and mass-produced while using sintered ceramic having a high dielectric constant.

BACKGROUND

In recent portable electronic devices, there is an increasing tendency to employ a metal housing so as to improve an aesthetic impression and robustness. The portable electronic device employs a conductive elastic portion, such as a conductive gasket or a conductive clip, between an external housing and an internal circuit substrate of the portable electronic device for alleviating impact from the outside and, simultaneously, reducing electromagnetic waves penetrating into the portable electronic devices or being leaked therefrom, and for an electrical contact between an antenna disposed in the external housing and the internal circuit substrate.

However, since an electrical path between the external housing and the internal circuit substrate may be formed due to the conductive elastic portion, when static electricity having high voltage instantaneously flows through a conductor such as an external metal housing, the static electricity can flow into the internal circuit substrate through the elastic portion to damage an integrated circuit (IC) and the like, and a leakage current generated by an alternating current (AC) power source flows to the external housing along a ground of a circuit so that a user is uncomfortable, and, in the worst case, the leakage current results in electric shock which may cause injury to the user.

A protective element for protecting the user from the static electricity or the leakage current is provided together with a conductive elastic portion connecting the metal housing and the circuit substrate. As a conductor such as a metal case is used, it is required for a functional contactor which has various functions for not only a simple electrical contact but also for protecting a user or a circuit in a portable electronic device or smoothly transferring a communication signal.

Meanwhile, since a protective element used in a conventional functional contactor is formed of sintered ceramic, it is difficult to manufacture the conventional functional contactor due to applying complicated and various electrode structures and thus mass production is not easy such that a manufacturing cost cannot be reduced such as to become a hindrance factor for commercialization. Consequently, there is a pressing need for a strategy of mass production.

Further, during a process of bonding the conductive elastic portion to the protective element by soldering, since the conductive elastic portion and the protective element are individually bonded, it is difficult to manufacture the conventional functional contactor. In particular, since both of the conductive elastic portion and the protective element have a small size, a great deal of time and effort are put into a precise bonding between the conductive elastic portion and the protective element and mass production of the conventional functional contactor is difficult such that there is a pressing need for improvement of bonding the conductive elastic portion to the protective element.

SUMMARY OF THE INVENTION

The present invention is directed to providing a functional contactor which is capable of being mass-produced by implementing a functional element using sintered ceramic having a high dielectric constant and a large-area substrate.

Further, the present invention is directed to providing a functional contactor which is capable of being easily manufactured by performing a soldering process of a conductive elastic portion using a large-area substrate with a functional element.

One aspect of the present invention provides a functional contactor including a conductive elastic portion configured to come into electrical contact with one among a circuit substrate of an electronic device, a bracket coupled to the circuit substrate, and a conductor contactable with a human body and having an elastic force; a substrate made of a dielectric material and having a groove formed in either an upper surface or a lower surface of the substrate; and a functional element inserted into the groove and including a high dielectric material made of sintered ceramic having a dielectric constant that is higher than that of the dielectric material, a first electrode disposed on an upper surface of the substrate and electrically connected to the conductive elastic portion in series, and a second electrode opposite to the first electrode and disposed on a lower surface of the substrate.

The high dielectric material may be made of a low temperature co-fired ceramic (LTCC) or a varistor material.

The varistor material may include a semiconductive material containing one or more of ZnO, $SrTiO_3$, $BaTiO_3$, and SiC, or one of Pr- and Bi-based materials.

The dielectric material may be made of flame retardant 4 (FR4) or polyimide (PI).

Another aspect of the present invention provides a functional contactor including a conductive elastic portion configured to come into electrical contact with one among a circuit substrate of an electronic device, a bracket coupled to the circuit substrate, and a conductor contactable with a human body and having an elastic force; a substrate comprised of a plurality of dielectric material layers; and a functional element including a first electrode electrically connected in series to the conductive elastic portion, and a second electrode disposed to be opposite to the first electrode at a predetermined interval. The plurality of dielectric material layers may be disposed between the first electrode and the second electrode, a first dielectric material layer, a second dielectric material layer, and a third dielectric material layer may be sequentially stacked on the second electrode, and the second dielectric material layer may be made of sintered ceramic having a dielectric constant that is higher than that of each of the first dielectric material layer and the third dielectric material layer.

The second dielectric material may be made of a low temperature co-fired ceramic (LTCC) or a varistor material.

Each of the first dielectric material layer and the third dielectric material layer may be made of flame retardant 4 (FR4) or polyimide (PI).

The first electrode and the second electrode may be formed on an entirety or part of upper and lower surfaces of the substrate, respectively.

The functional element may have an electric shock prevention function of blocking a leakage current of an external power source flowing from the ground of a circuit substrate of the electronic device, a communication signal transmission function of passing a communication signal flowed from a conductive case or the circuit substrate, and an electrostatic discharge (ESD) protection function of passing the ESD without a dielectric breakdown when the ESD flows from the conductive case.

The conductive elastic portion may include one among a conductive gasket, a silicone rubber pad, and a clip-shaped conductor having an elastic force.

The conductive elastic portion may be in line-contact or point-contact so as to reduce galvanic corrosion.

In accordance with the present invention, an electrode of a functional element is configured using a large-area substrate and sintered ceramic with a high dielectric constant is inserted into the substrate or implemented as a part of the substrate. Consequently, a functional contactor is easily manufactured and is suitable for mass production such that a manufacturing cost and a processing time can be reduced and thus efficiency of a manufacturing process can be improved.

Further, in accordance with the present invention, a conductive elastic portion is bonded onto a large-area substrate provided with a functional element through soldering such that the conductive elastic portion can be easily aligned with and stably bonded to the substrate, thereby improving reliability of a product.

Furthermore, in accordance with the present invention, since sintered ceramic having a high dielectric constant is used, it is possible to compensate for degradation in performance of the functional element implemented using the large-area substrate such that mass production is possible and a characteristic of the product can be improved.

Moreover, in accordance with the present invention, the sintered ceramic is inserted into a groove of the substrate and thus it is possible to stably and easily implement bonding between a high dielectric material and the substrate made of a different material such that reliability of the product and ease of a manufacturing process can be further improved.

DETAILED DESCRIPTION OF THE INVENTION

Figure 1:
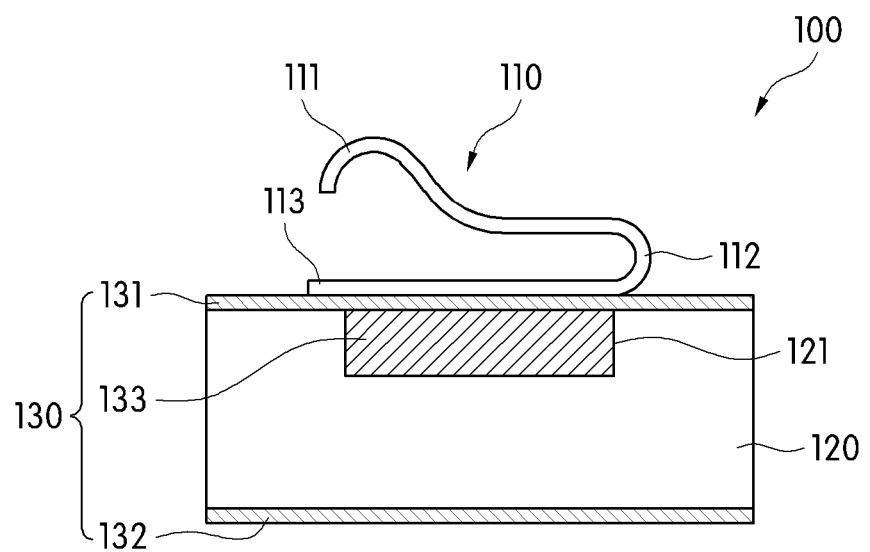
FIG. 1 is a sectional view of an example of a functional contactor according to a first embodiment of the present invention.

Hereinafter, embodiments of the present invention will be fully described in detail which is suitable for easy implementation by those skilled in the art to which the present invention pertains with reference to the accompanying drawings. The present invention may be implemented in various different forms, and thus it is not limited to embodiments which will be described herein. In the drawings, some portions not related to the description will be omitted in order to clearly describe the present invention, and the same or similar reference numerals are given to the same or similar components throughout this disclosure.

Figure 2:
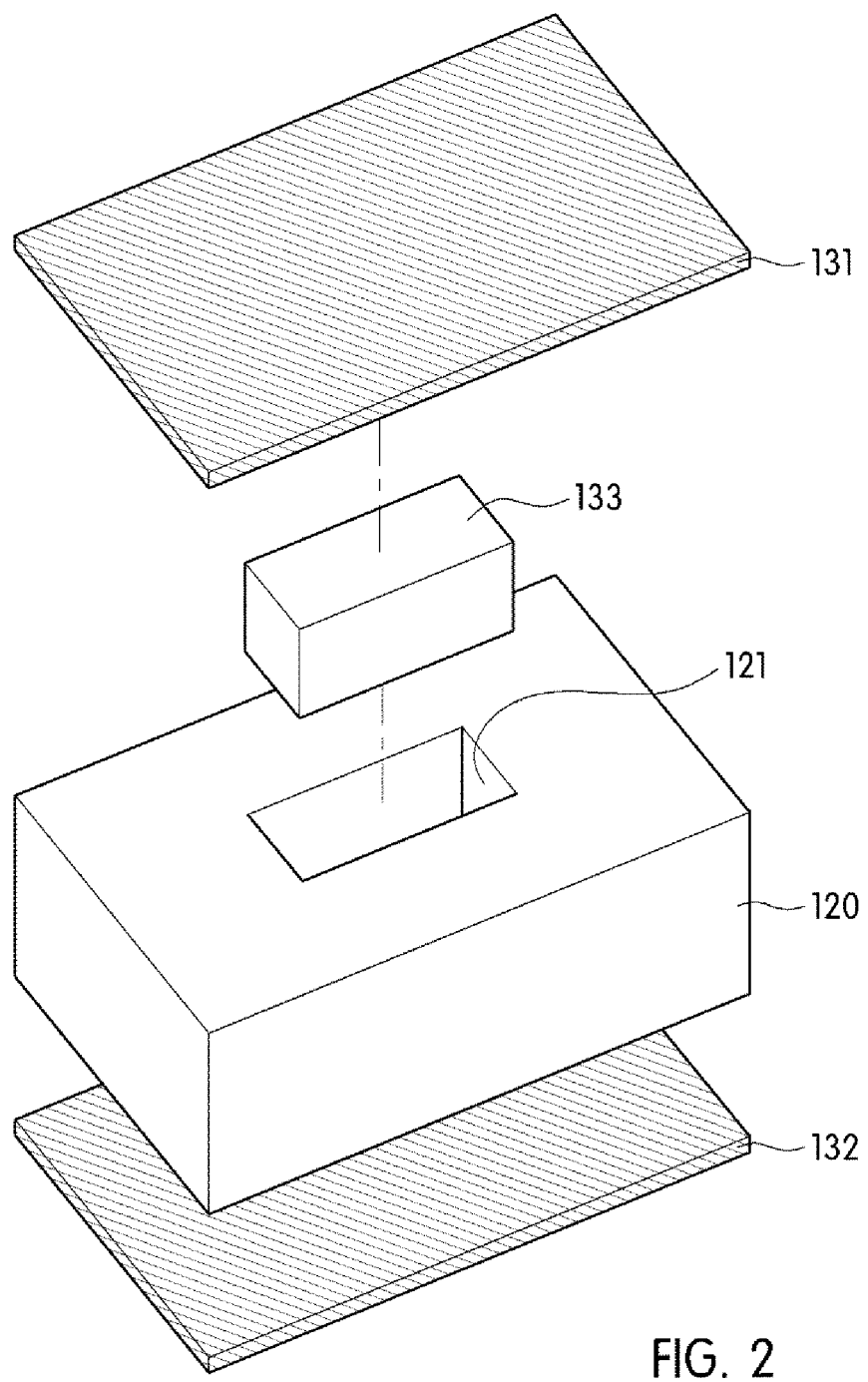
FIG. 2 is an exploded perspective view of a substrate and a functional element of FIG. 1.

As shown in FIGS. 1 and 2, a functional contactor 100 according to a first embodiment of the present invention includes a conductive elastic portion 110, a substrate 120, and a functional element 130.

In a portable electronic device, the functional contactor 100 is configured to electrically connect a conductive case such as an external metal case to a circuit substrate or to electrically connect the conductive case to a conductive bracket electrically coupled to one side of the circuit substrate.

That is, in the functional contactor 100, the conductive elastic portion 110 may come into contact with the circuit substrate or the conductive bracket and the substrate 120 may be coupled to the conductive case. Contrarily, the conductive elastic portion 110 may come into contact with the conductive case and the substrate 120 may be coupled to the circuit substrate.

For example, when the functional contactor 100 is a functional contactor of a surface mount technology (SMT)

type, i.e., the functional contactor 100 is coupled through soldering, the substrate 120 may be bonded to the circuit substrate of the portable electronic device, and when the functional contactor 100 is a functional contactor of an adhesive layer type, i.e., the functional contactor 100 is coupled through a conductive adhesive layer, the substrate 120 may be coupled to the conductive case.

Meanwhile, the portable electronic device may be formed as a portable electronic device which is portable and easy to carry. For example, the portable electronic device may be a portable terminal such as a smart phone, a cellular phone, or the like and may be a smart watch, a digital camera, a digital multimedia broadcasting (DMB), an electronic book, a netbook, a tablet personal computer (PC), a portable computer, or the like. The electronic device may have any suitable electronic components including antenna structures for communicating with external devices. Further, the electronic device may be a device using a local area network communication such as Wi-Fi or Bluetooth.

Here, the conductive case may be an antenna for communication between the portable electronic device and an external device. For example, the conductive case may be provided to partially or entirely surround a side portion of the portable electronic device.

The conductive elastic portion 110 comes into electrical contact with any one among the circuit substrate of the electronic device, the bracket coupled to the circuit substrate, and a conductor contactable with a human body and has an elastic force.

In FIG. 1, although the conductive elastic portion 110 has been shown and described as being a clip-shaped conductor having an elastic force, the present invention is not limited thereto, and the conductive elastic portion 110 may be a conductive gasket or a silicone rubber pad.

Here, when the conductive elastic portion 110 comes into contact with the circuit substrate, the conductive bracket, and the conductor, the conductive elastic portion 110 may be contracted to the substrate 120 due to a pressing force, and when the conductive case is separated from the portable electronic device, the conductive elastic portion 110 may be restored to its original state due to the elastic force.

Meanwhile, when the conductive elastic portion 110 is pressurized, galvanic corrosion occurs due to a potential difference between dissimilar metals. In this case, in order to minimize galvanic corrosion, the conductive elastic portion 110 may be formed to have a small contact area.

That is, the conductive elastic portion 110 may be configured not only to be in surface-contact but also may be in line-contact and/or point-contact. In this case, when the conductive elastic portion 110 is the conductive gasket or the silicone rubber pad, the conductive elastic portion 110 may be in surface-contact, whereas, when the conductive elastic portion 110 is the clip-shaped conductor, the conductive elastic portion 110 may be in line-contact and/or point-contact.

For example, when the conductive elastic portion 110 is the clip-shaped conductor, the clip-shaped conductor includes a contact portion 111, a bent portion 112, and a terminal 113.

Here, the clip-shaped conductor may be a C-shaped clip which is substantially "C" shaped. Since the clip-shaped conductor 110 is in line-contact or point-contact, galvanic corrosion resistance may be excellent.

The contact portion 111 may have a curved shape and come into electrical contact with the conductive case and either the circuit substrate or the conductive bracket. The bent portion 112 may be formed to extend from the contact portion 111 and may have an elastic force. The terminal 113 may be a terminal electrically connected to the substrate 120.

The contact portion 111, the bent portion 112, and the terminal 113 may be integrally formed of a conductive material having an elastic force.

The substrate 120 is made of a dielectric material, and a groove 121 is formed on an upper surface of the substrate 120. Here, the dielectric material may be made of flame retardant 4 (FR4) or polyimide (PI) so as to be able to be manufactured into a large-area substrate and allow an electrode to be easily formed.

In this case, as described below, a high dielectric material 133 made of sintered ceramic may be inserted into the groove 121 through an insulating adhesive layer. That is, since the substrate 120 and the high dielectric material 133 are made of different materials, the substrate 120 may be bonded to the high dielectric material 133 through the insulating adhesive layer.

However, the bonding of the substrate 120 and the high dielectric material 133 is not limited thereto, and a stacking method is not particularly limited as long as it can ensure a bonding force between the substrate 120 and the high dielectric material 133.

As described above, since the substrate into which the sintered ceramic is inserted is used, formation of an electrode may be facilitated using a substrate manufacturing process and a large-area substrate may be used such that it is possible to easily manufacture the functional element 130 and mass production thereof may be possible.

Meanwhile, the substrate 120 may serve as a guide as a medium for fixing the conductive elastic portion 110 and the functional element 130 and coupling the conductive elastic portion 110 and the functional element 130 to the conductive case. That is, when the conductive elastic portion 110 is bonded to the functional element 130, even though soldering is difficult, the substrate 120 may provide stable bonding through the conductive adhesive layer or the like.

The functional element 130 is electrically connected in series to the conductive elastic portion 110 and is integrally formed with the substrate 120. Here, the functional element 130 may have a function of protecting a user or an internal circuit.

That is, the functional element 130 may block a leakage current of an external power source flowing from a ground of a circuit substrate of an electronic device. In this case, the functional element 130 may be configured to have a breakdown voltage Vbr or a withstanding voltage that is higher than a rated voltage of the external power source of the electronic device. Here, the rated voltage may be a standard rated voltage for each country. For example, the rated voltage may be any one among 240 V, 110 V, 220 V, 120 V, and 100 V.

Further, when the conductive case has a function of an antenna, the functional element 130 may serve as a capacitor to block the leakage current of the external power source and to pass a communication signal flowed from the conductor or the circuit substrate.

Further, the functional element 130 may pass an electrostatic discharge (ESD) flowing from the conductive case without a dielectric breakdown. In this case, the functional element 130 may be configured to have a breakdown voltage Vbr that is lower than a dielectric breakdown voltage Vcp of each of the substrate 120 and the high dielectric material 133.

Accordingly, the functional contactor 100 may electrically connect the conductive case to the circuit substrate to allow the communication signal, the ESD, and the like to be passed, but the functional contactor 100 may block the leakage current of the external power source from the circuit substrate from flowing to the conductive case.

For example, as shown in FIGS. 1 and 2, the functional element 130 includes a first electrode 131, a second electrode 132, and the high dielectric material 133.

The first electrode 131 is disposed on an upper surface of the substrate 120 to be electrically connected to the conductive elastic portion 110. The first electrode 131 is disposed on the substrate 120 and the high dielectric material 133 which are made of different materials. Therefore, the first electrode 131 may be bonded to the upper surface of the substrate 120 through an insulating adhesive layer.

Further, the first electrode 131 may be formed on an entirety of the upper surface of the substrate 120 to increase capacitance.

The second electrode 132 is opposite to the first electrode 131 and is disposed on a lower surface of the substrate 120. The second electrode 132 may be formed on an entirety of the lower surface of the substrate 120.

The high dielectric material 133 is inserted into the groove 121 of the substrate 120. As described above, since the high dielectric material 133 is confined by the groove 121 and thus movement of the high dielectric material 133 is restricted, bonding of the substrate 120 and the high dielectric material 133 which are made of different materials may be performed stably. Further, the high dielectric material 133 is inserted into the groove 121 through the insulating adhesive layer, and the high dielectric material 133 may be easily coupled to the substrate 120 only by being inserted into the groove 121 and disposing the first electrode 131 on an upper side of the high dielectric material 133.

The high dielectric material 133 is made of sintered ceramic having a dielectric constant that is higher than that of a dielectric material of the substrate 120. For example, the high dielectric material 133 may be made of low temperature co-fired ceramic (LTCC) or a varistor material. Here, the varistor material may include a semiconductive material containing one or more of ZnO, $SrTiO_3$, $BaTiO_3$, and SiC, or any one of Pr- and Bi-based materials.

As described above, the functional element 130 is implemented using a high dielectric material such as sintered ceramic such that a characteristic of the functional element 130 may be improved. In other words, when a substrate manufacturing process is used for mass production, a dielectric constant required for the functional element 130 cannot be provided due to a dielectric material constituting the substrate. Therefore, the existing sintered ceramic having a high dielectric constant is inserted into the substrate 120 such that the characteristic of the functional element 130 may be improved.

In the functional element 130, a dielectric constant of the high dielectric material 133, a thickness between the first electrode 131 and the second electrode 132, and an area of each of the first electrode 131 and the second electrode 132 may be set such that a withstanding voltage of the functional element 130 is greater than a rated voltage of the external power source of the electronic device, and capacitance is formed to be able to pass a communication signal flowed from a conductor.

The functional element 130 configured as described above may prevent the user from being damaged due to electric shock and the like and prevent damage to the internal circuit through a conductor such as the conductive case. For example, when a leakage current flows from the ground of the circuit substrate of the electronic device, since the withstanding voltage between the first electrode 131 and the second electrode 132 is greater than the rated voltage of the external power source, the functional element 130 may block the leakage current of the external power source instead of allowing the leakage current to flow through the functional element 130.

Further, when a communication signal is flowed from the conductor or the circuit substrate, the functional element 130 may serve as a capacitor to perform a function of transferring the communication signal.

Further, when the ESD flows from the conductor, since a dielectric breakdown voltage between the first electrode 131 and the second electrode 132 is greater than a breakdown voltage therebetween, the functional element 130 may pass the ESD without a dielectric breakdown. The functional element 130 may be configured to transfer the ESD to the ground of the circuit substrate, thereby protecting the internal circuit.

Meanwhile, in the functional contactor according to the first embodiment of the present invention, the electrode and the high dielectric material may be variously modified.

Figure 3:
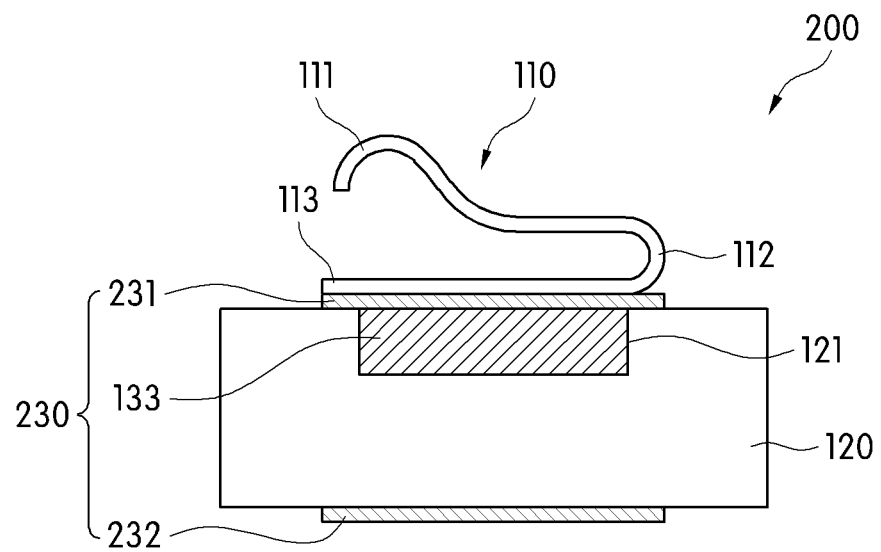
FIG. 3 is a cross-sectional view of another example of the functional contactor according to the first embodiment of the present invention.

As shown in FIG. 3, in order to facilitate a position alignment and bonding of the conductive elastic portion 110 when the conductive elastic portion 110 is solder-bonded, the first electrode 131 and the second electrode 132 of a functional contactor 200 may each be formed to have a small size that is similar to a size of a lower surface of the conductive elastic portion 110. That is, a first electrode 231 may be formed on a portion of the upper surface of the substrate 120, and a second electrode 232 may be formed on a portion of the lower surface of the substrate 120.

Figure 4:
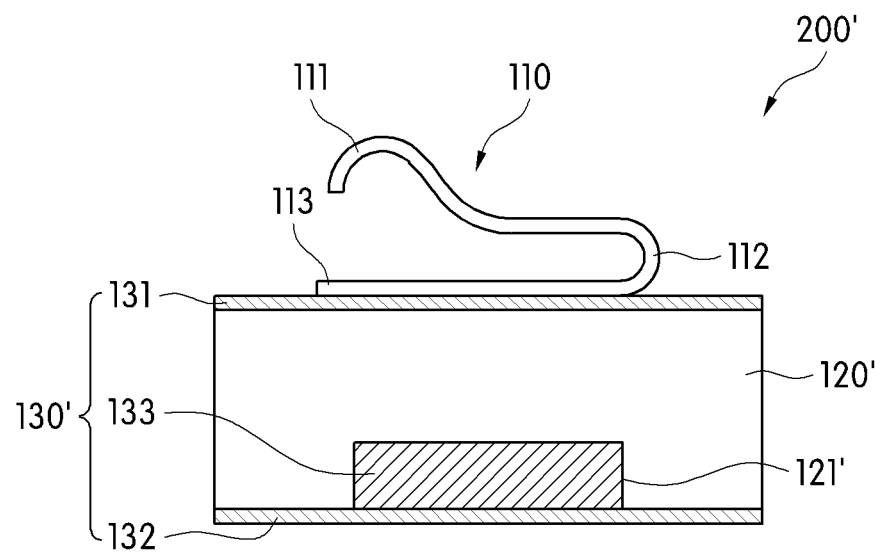
FIG. 4 is a cross-sectional view of still another example of the functional contactor according to the first embodiment of the present invention.

As shown in FIG. 4, a functional contactor 200' may be configured such that the high dielectric material 133 is provided at a lower portion of a substrate 120' to be covered with the second electrode 132. That is, a groove 121' may be formed in a lower surface of the substrate 120', and the high dielectric material 133 may be inserted into the groove 121'.

In this case, the second electrode 132 is disposed on the lower surface of the substrate 120' and disposed below the high dielectric material 133. Therefore, the second electrode 132 may be bonded to the lower surface of the substrate 120' through an insulating adhesive layer. Further, the first electrode 131 may be formed on an entirety of an upper surface of the substrate 120' using a substrate manufacturing process.

As described above, the functional elements 130, 230, and 130' are formed by inserting the sintered ceramic into the groove of the dielectric material substrate with which forming of the electrodes is facilitated. Therefore, as compared with the existing functional element made of only a ceramic material prepared through a sintering process, not only is it possible to easily manufacture the functional element 130, 230, or 130' because of being manufactured using a substrate manufacturing process, but also it may be suitable for mass production when a large-area substrate is used. Consequently, a manufacturing cost and a processing time can be reduced such that efficiency of a manufacturing process can be improved.

The functional contactor 100, 200, or 200' may be manufactured using a large-area substrate. For example, the functional contactor 100, 200, or 200' may be formed such that a plurality of functional elements 130 are provided on a large-area substrate 120a, and each of a plurality of conductive elastic portions 110 is soldered to the large-area substrate 120a and then cut in a unit size.

The manufacturing process of the functional contactor 100, 200, or 200' will be described in more detail with reference to FIGS. 4 to 6.

Figure 5:
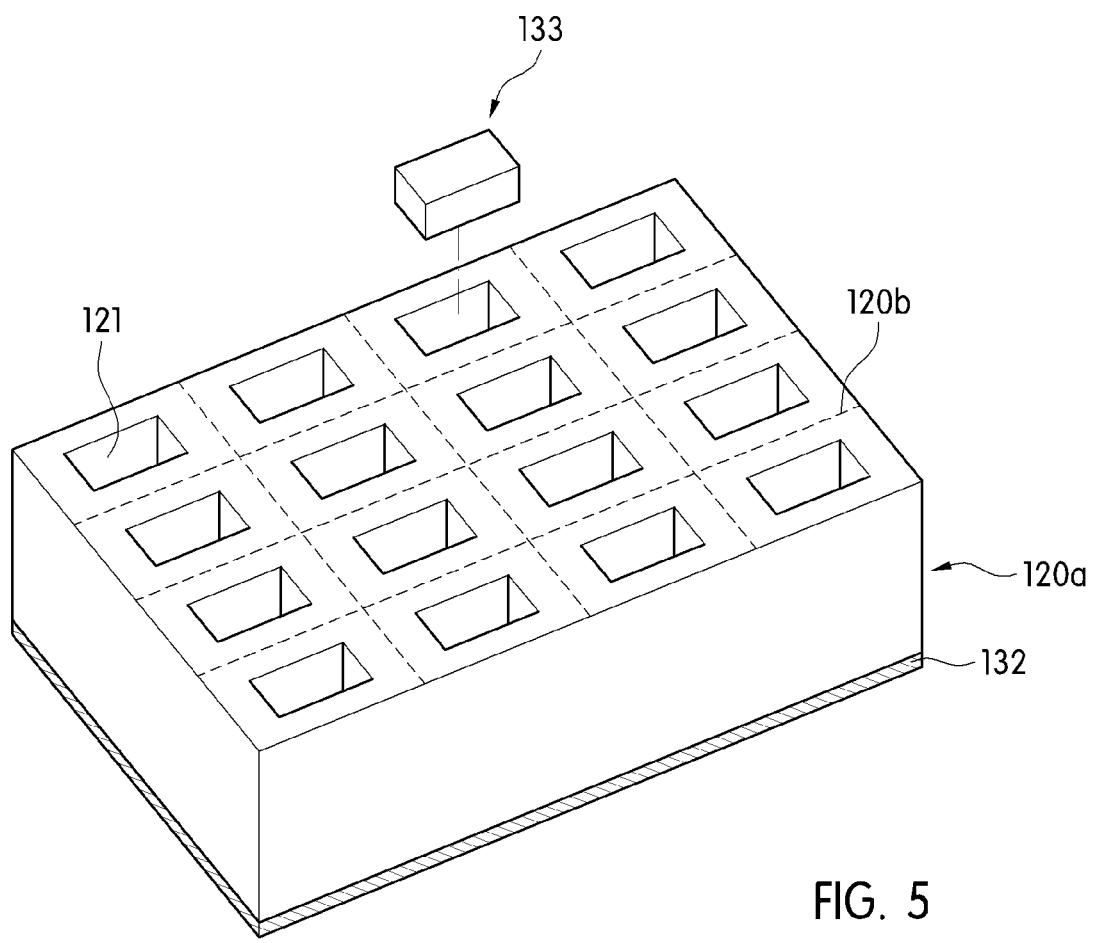
FIG. 5 is a perspective view illustrating a process of inserting a high dielectric material into a substrate during a process of manufacturing the functional contactor according to the first embodiment of the present invention.

First, as shown in FIG. 5, grooves 121 may be formed on the large-area substrate 120a through a substrate manufacturing process, and the second electrode 132 may be formed on a lower surface of the large-area substrate 120a.

Here, the second electrode 132 may be provided to have a size equal to an area of the lower surface of a unit substrate 120. Alternatively, the second electrode 232 may be formed in a small size corresponding to the conductive elastic portion 110 (see FIG. 3).

As described above, the second electrode 132 is formed below the substrate 120 through the substrate manufacturing process such that a process may be simplified.

In this case, a plurality of high dielectric materials 133 may be inserted into the grooves 121 formed in the large-area substrate 120a. The high dielectric materials 133 may be inserted into and bonded to the grooves 121 through insulating adhesive layers.

Figure 6:
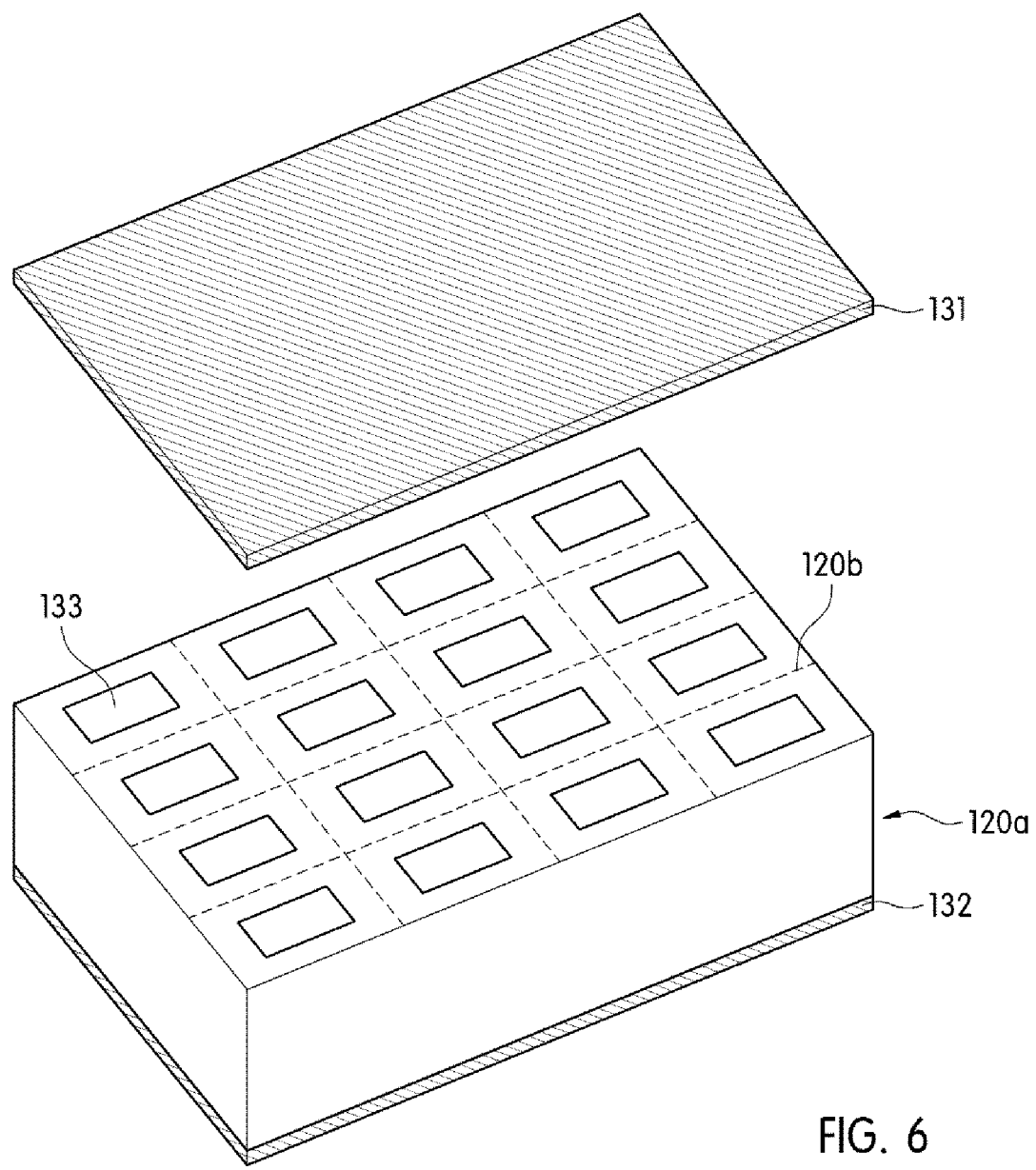
FIG. 6 is a perspective view illustrating a process of forming a first electrode during the process of manufacturing the functional contactor according to the first embodiment of the present invention.

As shown in FIG. 6, the first electrode 131 may be formed on the large-area substrate 120a. Here, the first electrode 131 may be formed to have a size equal to an area of an upper surface of the unit substrate. The first electrode 131 may be bonded to the large-area substrate 120a through an insulating adhesive layer.

Alternatively, when the first electrode 231 is formed in a small size corresponding to the conductive elastic portion 110 (see FIG. 8), i.e., when a plurality of first electrodes 231 are provided on the substrate 120, the plurality of first electrodes 231 may be respectively bonded to the unit substrates 120 through insulating adhesive layers.

As described above, the functional element 130, 230, or 130' is implemented on the substrate 120 using the large-area substrate 120a such that the functional element 130, 230, or 130' may be easily manufactured and mass-produced. Further, since the functional element 130 is implemented during the manufacturing process of the substrate 120, a process may be simplified as compared with a case in which the functional element 130 is coupled to a guide.

Figure 7:
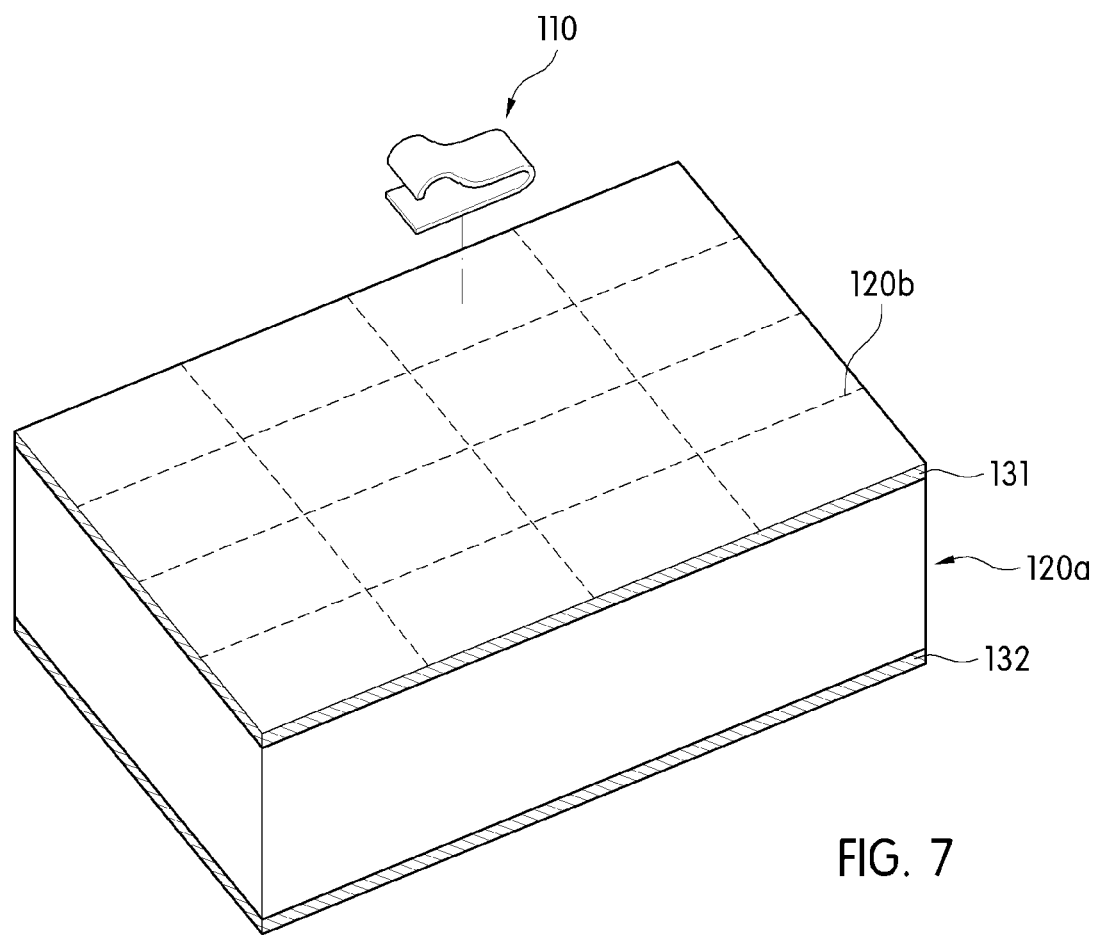
FIG. 7 is a perspective view illustrating an example of a process of soldering a conductive elastic portion during the process of manufacturing the functional contactor according to the first embodiment of the present invention.
Figure 8:
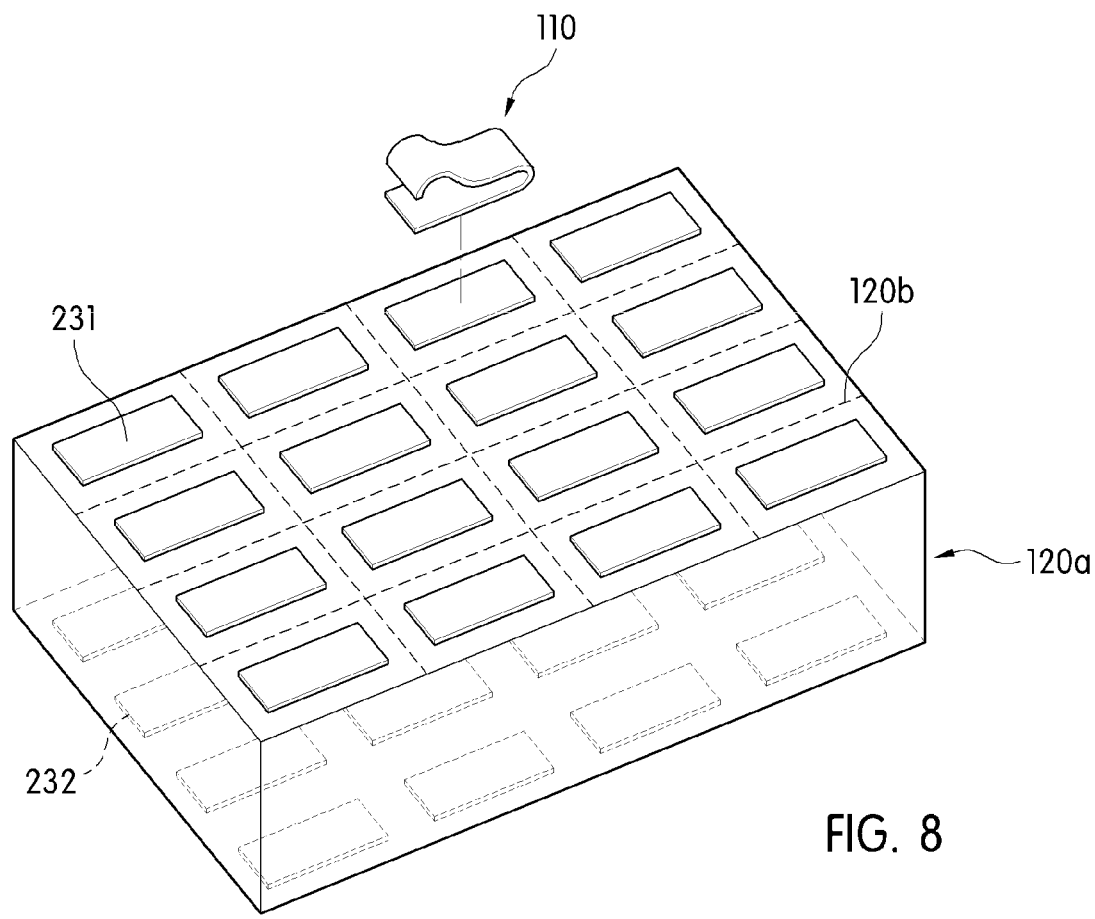
FIG. 8 is a perspective view illustrating another example of the process of soldering the conductive elastic portion during the process of manufacturing the functional contactor according to the first embodiment of the present invention.

As shown in FIGS. 7 and 8, the conductive elastic portion 110 may be bonded to the large-area substrate 120a provided with the functional element 130, 230, or 130' through soldering.

That is, in a state in which the first electrode 131 is integrally formed on the upper surface of the large-area substrate 120a provided with the functional element 130, a plurality of conductive elastic portions 110 are soldered on the first electrode 131 through solder such that the conductive elastic portion 110, the substrate 120, and the functional element 130 may be integrally formed (see FIG. 7).

Here, since the first electrode 131 is formed to be larger than each of the conductive elastic portions 110 and thus an alignment of the conductive elastic portions 110 may not be easy, a stopper for aligning positions of the conductive elastic portions 110 may be provided on the first electrode 131.

Alternatively, when a plurality of first electrodes 231 are formed on the upper surface of the large-area substrate 120a provided with the functional elements 130 (see FIG. 8), that is, when each of the first electrodes 231 is formed to have a size similar to that of each of the conductive elastic portions 110, the plurality of conductive elastic portions 110 may be soldered to the plurality of first electrodes 231.

As described above, since the plurality of conductive elastic portions 110 are soldered to the first electrode 131 or the plurality of first electrodes 231 integrally formed on the large-area substrate 120a using solder, an alignment and soldering of the conductive elastic portions 110 may be performed easily and accurately as compared with a conventional individual coupling such that efficiency of a manufacturing process as well as reliability of a product may be improved.

In this case, the large-area substrate 120a is cut along a cutting line 120b having a unit size such that a unit functional contactor 100, 200, and 200' may be manufactured in large quantities.

As described above, since the implementation of the plurality of functional elements 130, 230, or 130' and the soldering of the conductive elastic portions 110 may be carried out simultaneously in large quantities using the large-area substrate 120a, mass production of the functional contactor 100, 200, or 200' may be possible.

Meanwhile, in the present invention, a part of a substrate may be made of a high dielectric material.

Figure 9:
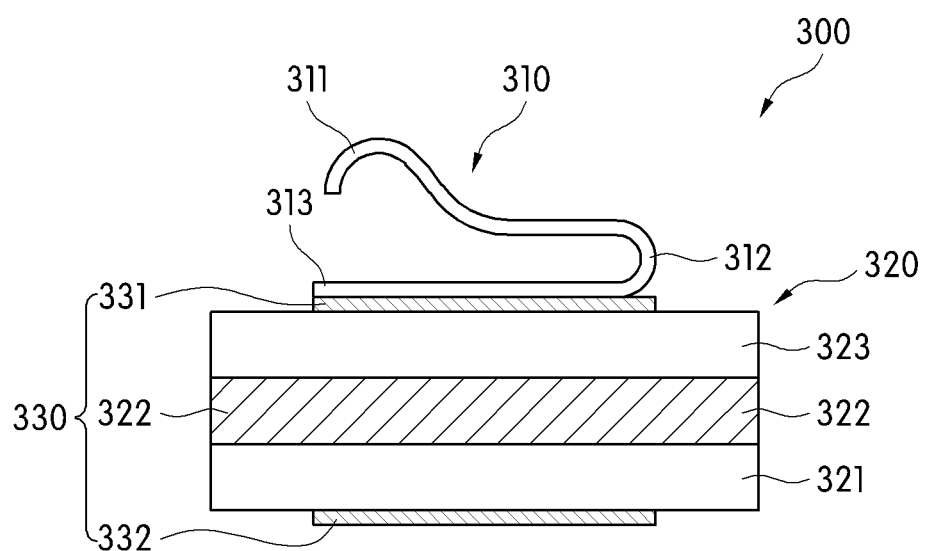
FIG. 9 is a cross-sectional view of an example of a functional contactor according to a second embodiment of the present invention.
Figure 10:
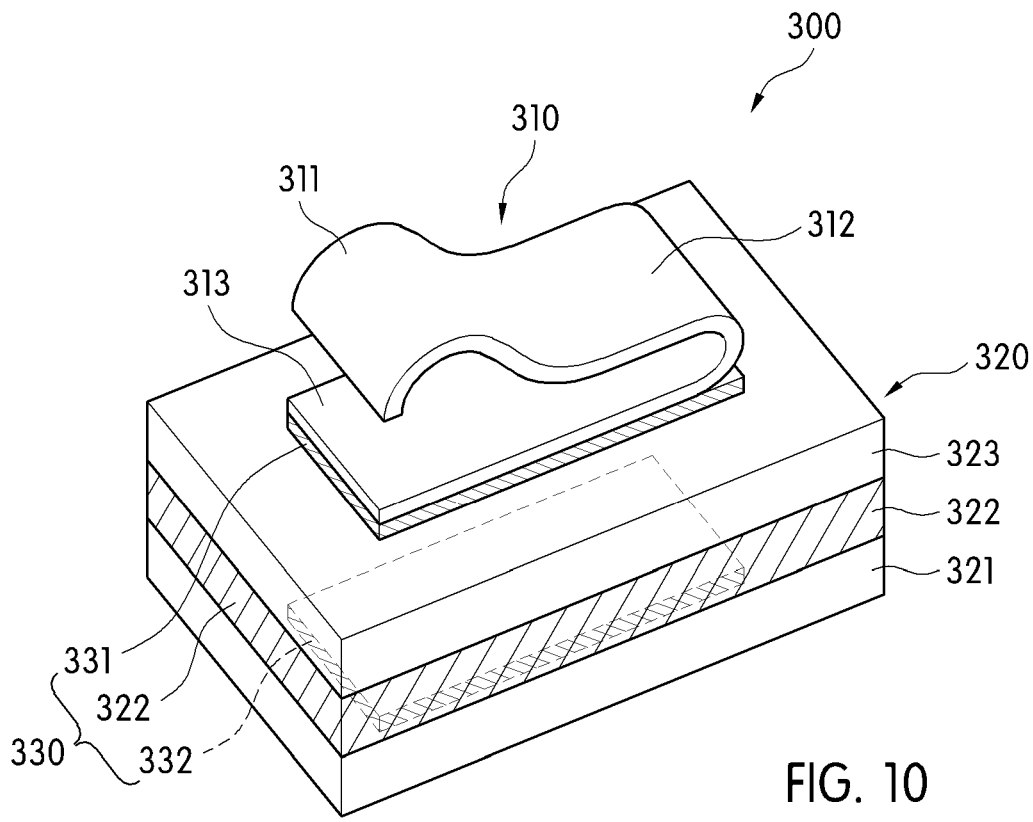
FIG. 10 is a perspective view of the functional contactor of FIG. 9.

As shown in FIGS. 9 and 10, a functional contactor 300 according to a second embodiment of the present invention includes a conductive elastic portion 310, a substrate 320, and a functional element 330.

A configuration of the conductive elastic portion 310 is identical to that of the conductive elastic portion 110 of the first embodiment, and thus a detailed description thereof will be omitted.

The substrate 320 is comprised of a plurality of dielectric layers 321, 322, and 323. For example, the substrate 320 may be comprised of three dielectric layers 321, 322, and 323. That is, the three dielectric layers 321, 322, and 323 are disposed between a first electrode 331 and a second electrode 332 and are sequentially stacked on the second electrode 332. The first dielectric layer 321 may be disposed at a lowermost portion of the substrate 320, the second dielectric layer 322 may be disposed on the first dielectric layer 321, and the third dielectric layer 323 may be disposed on the second dielectric layer 322.

Here, the second dielectric layer 322 is formed of sintered ceramic having a dielectric constant that is higher than that of each of the first dielectric layer 321 and the second dielectric layer 322. For example, the second dielectric layer 322 may be made of LTCC or a varistor material. As described below, the second dielectric layer 322 forms a part of the functional element 330.

Further, the first dielectric layer 321 and the third dielectric layer 323 may each be made of FR4 or PI so as to be able to be manufactured into a large-area substrate and allow an electrode to be easily formed. Here, the first dielectric layer 321 and the third dielectric layer 323 may be formed of materials having different dielectric constants according to a characteristic of an electrode which will be formed.

That is, one of the first dielectric layer 321 and the third dielectric layer 323 may be made of PI, and the other thereof may be made of FR4. For example, the first dielectric layer 321 may be made of PI, and the third dielectric layer 323 may be formed of FR4.

In this case, the first dielectric layer 321 and the second dielectric layer 322 may be stacked through an insulating adhesive layer provided there between, and the second dielectric layer 322 and the third dielectric layer 323 may be stacked through an insulating adhesive layer provided there between. That is, the first dielectric layer 321, the third dielectric layer 323, and the second dielectric layer 322 disposed between the first dielectric layer 321 and the third dielectric layer 323 are made of different materials such that the first dielectric layer 321, the third dielectric layer 323, and the second dielectric layer 322 may be stacked through insulating adhesive layers.

However, the stacking of the plurality of dielectric layers 321, 322, and 323 is not limited thereto, and a stacking method is not particularly limited as long as it can ensure a bonding force between the plurality of dielectric layers 321, 322, and 323.

As described above, since the dielectric material layers of the substrate are provided on both sides of the sintered ceramic, formation of an electrode may be facilitated using a substrate manufacturing process and a large-area substrate may be used such that it is possible to easily manufacture the functional element 330 and mass production thereof may be possible.

Meanwhile, the substrate 320 may serve as a guide as a medium for fixing the conductive elastic portion 310 and the functional element 330 and coupling the conductive elastic portion 110 and the functional element 130 to a conductive case. That is, when the conductive elastic portion 310 is bonded to the functional element 330, even though soldering is difficult, the substrate 320 may provide stable bonding through the conductive adhesive layer or the like.

The functional element 330 is electrically connected in series to the conductive elastic portion 310 and is integrally formed with the substrate 320. Here, a function of the functional element 330 is identical to that of the functional element 130, 230, or 130' of the first embodiment, and thus a detailed description thereof will be omitted.

For example, as shown in FIGS. 9 and 10, the functional element 330 includes the first electrode 331, the second electrode 332, and the second dielectric layer 322.

The first electrode 331 is disposed on an upper side of the third dielectric layer 323 to be electrically connected to the conductive elastic portion 310. The first electrode 331 may be formed on a part of the upper surface of the third dielectric layer 323.

Further, in order to facilitate a position alignment and a bonding of the conductive elastic portion 310 when the conductive elastic portion 310 is solder-bonded, the first electrode 331 may be formed to have a size similar to that of a lower surface of the conductive elastic portion 310.

The second electrode 332 is disposed opposite to the first electrode 331 at a regular interval and disposed below the first dielectric layer 321. The second electrode 332 may be formed on a part of a lower surface of the third dielectric layer 321. The second electrode 332 may be formed to have a size equal to that of the first electrode 331.

The second dielectric layer 322 is disposed between the first dielectric layer 321 and the third dielectric layer 323. The second dielectric layer 322 is made of a high dielectric material having a dielectric constant that is higher than a dielectric constant of the first dielectric layer 321 provided below the second dielectric layer 322 and is higher than a dielectric constant of the third dielectric layer 323 provided above the second dielectric layer 322.

The second dielectric layer 322 may be made of sintered ceramic, e.g., LTCC or a varistor material. Here, the varistor material may include a semiconductive material containing one or more of ZnO, $SrTiO_3$, $BaTiO_3$, and SiC, or any one of Pr- and Bi-based materials.

As described above, the functional element 330 is implemented using a high dielectric material such as sintered ceramic such that a characteristic of the functional element 330 may be improved. In other words, when a substrate manufacturing process is used for mass production, a dielectric constant required for the functional element 330 cannot be provided due to the dielectric material layers constituting the substrate. Therefore, the existing sintered ceramic having a high dielectric constant is inserted into the substrate 320 such that the characteristic of the functional element 330 may be improved.

In the functional element 330, a dielectric constant of the second dielectric layer 322, a thickness between the first electrode 331 and the second electrode 332, and an area of each of the first electrode 331 and the second electrode 332 may be set such that a withstanding voltage of the functional element 130 is greater than a rated voltage of the external power source of the electronic device, and capacitance is formed to be able to pass a communication signal flowed from a conductor.

Meanwhile, in the functional contactor according to the second embodiment of the present invention, the electrodes may be variously modified.

Figure 11:
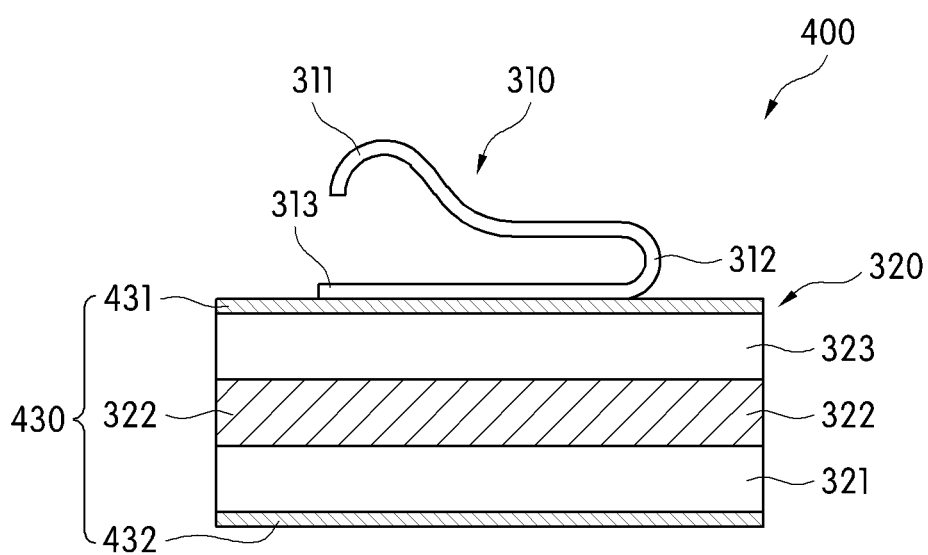
FIG. 11 is a cross-sectional view of another example of the functional contactor according to the second embodiment of the present invention.

As shown in FIG. 11, in order to increase capacitance, a first electrode 431 and a second electrode 432 of a functional contactor 400 may each be formed to be large. That is, the first electrode 431 may be formed on an entirety of an upper surface of the third dielectric layer 323, and the second electrode 432 may be formed on an entirety of a lower surface of the first dielectric layer 321.

As described above, the functional element 330 or 430 is formed by providing the dielectric material layers, with which forming of the electrodes is facilitated, on both sides of the sintered ceramic. Therefore, as compared with the existing functional element made of only a ceramic material prepared through a sintering process, not only it is possible to easily manufacture the functional element 330 or 430 because of being manufactured using a substrate manufacturing process, but also it may be suitable for mass production when a large-area substrate is used. Consequently, a manufacturing cost and a processing time can be reduced such that efficiency of a manufacturing process can be improved.

The functional contactor 300 or 400 may be manufactured using a large-area substrate. For example, the functional contactor 300 or 400 may be formed such that a plurality of functional elements 330 are provided on a large-area substrate 320a, and each of a plurality of conductive elastic portions 310 is soldered to the large-area substrate 320a and then cut in a unit size.

The manufacturing process of the functional contactor 300 or 400 will be described in more detail with reference to FIGS. 12 to 14.

Figure 12:
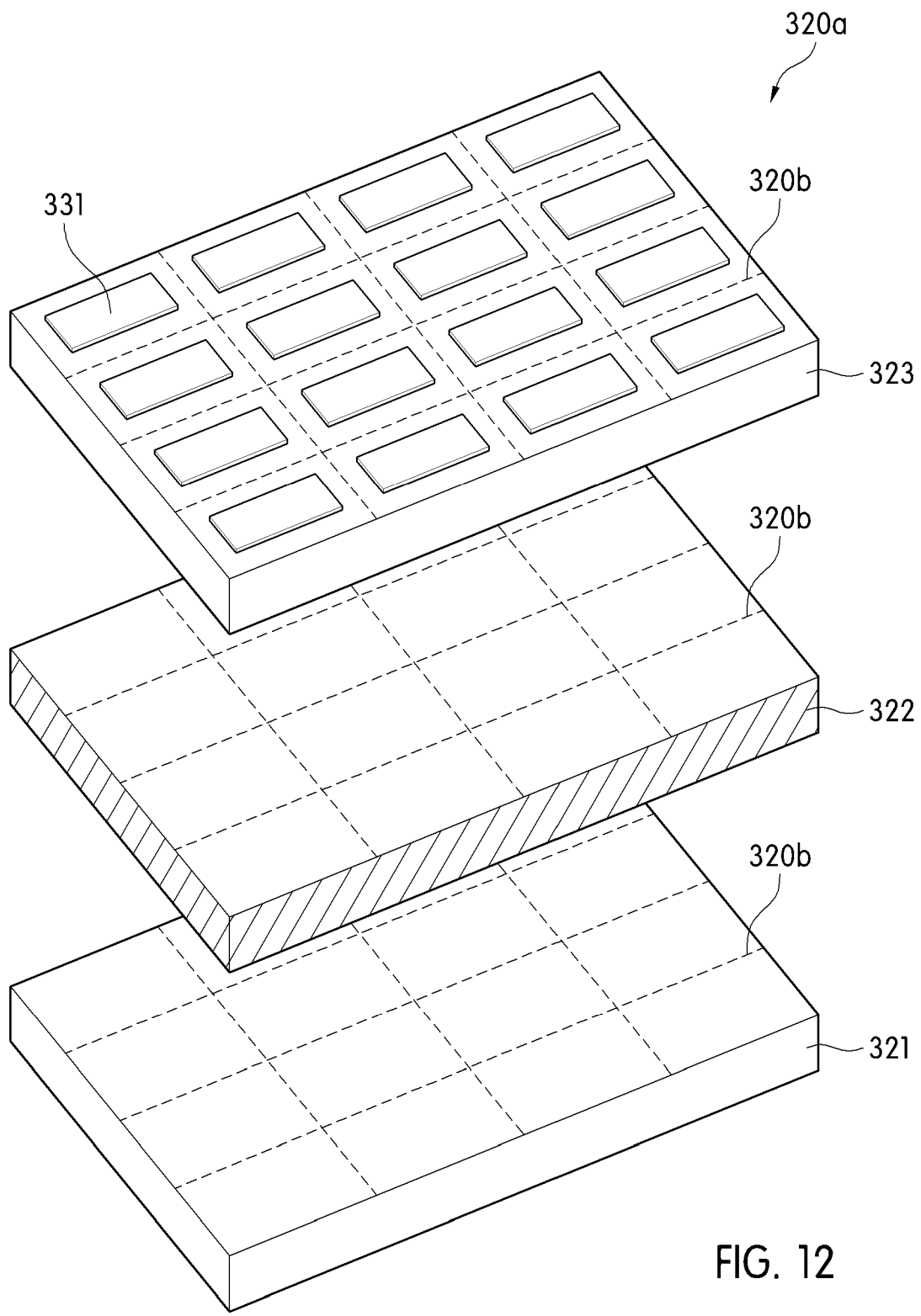
FIG. 12 is a perspective view illustrating a process of forming a substrate during a process of manufacturing the functional contactor according to the second embodiment of the present invention.

First, as shown in FIG. 12, a large-area substrate 320a corresponding to each of the plurality of dielectric layers 321, 322, and 323 may be formed. In this case, through the substrate manufacturing process, a second electrode 332 may be formed on the lower surface of the first dielectric layer 321, and the first electrode 331 may be formed on an upper surface of the third dielectric layer 323. Here, the first electrode 331 and the second electrode 332 may each be formed in a small size corresponding to the conductive elastic portion 310 (see FIG. 13).

Figure 14:
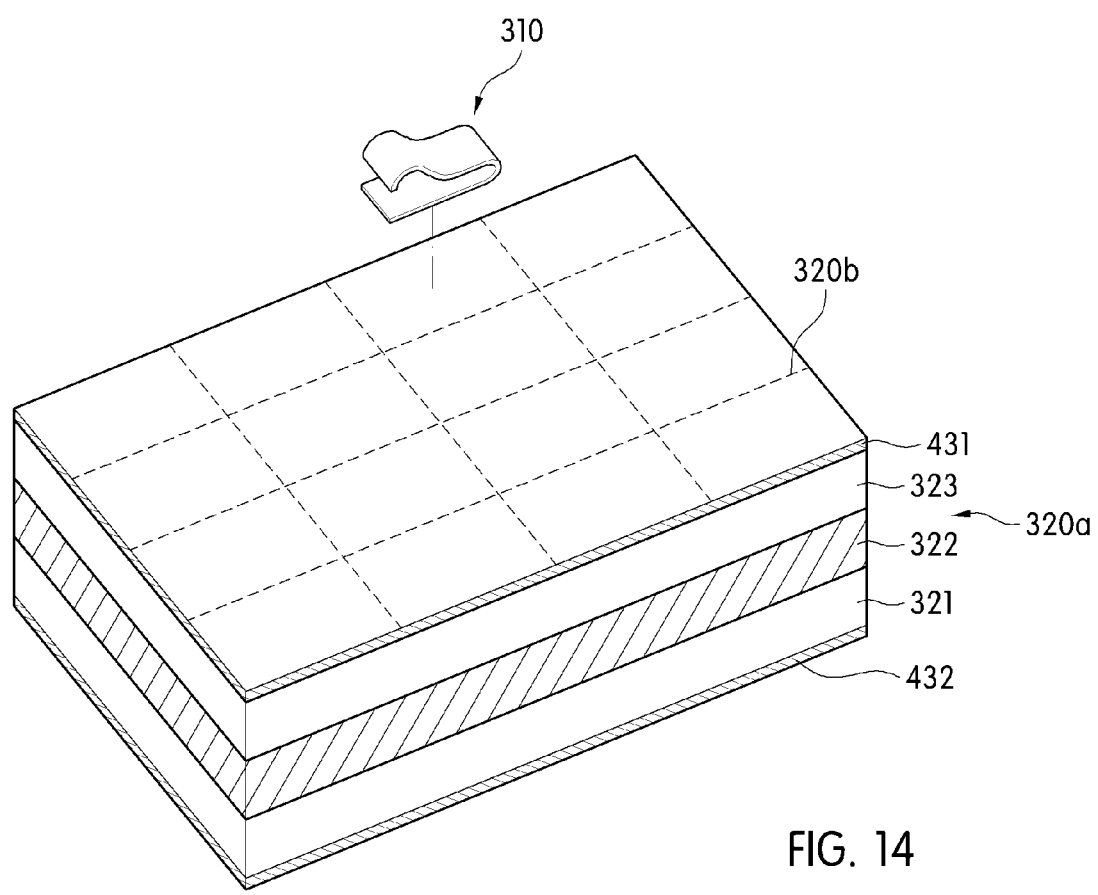
FIG. 14 is a perspective view illustrating another example of the process of soldering the conductive elastic portion during the process of manufacturing the functional contactor according to the second embodiment of the present invention.

Alternatively, the first electrode 431 may be provided to have a size equal to an area of an upper surface of a unit third dielectric layer 323, and the second electrode 432 may be provided to have a size equal to an area of a lower surface of a unit first dielectric layer 321 (see FIG. 14).

As described above, the first electrode 431 is formed an upper side of the third dielectric layer 323, and the second electrode 432 is formed a lower side of the first dielectric layer 321 through the substrate manufacturing process such that a process may be simplified.

Here, the plurality of dielectric layers 321, 322, and 323 may be sequentially stacked (see FIG. 12). That is, the second dielectric layer 322 may be disposed on the upper surface of the first dielectric layer 321 on which the second electrode 332 is not formed, and a lower surface of the third dielectric layer 323 on which the first electrode 331 is not formed may be disposed on the second dielectric layer 322. In this case, the second dielectric layer 322 may be bonded between the third dielectric layer 323 on which the first electrode 331 is formed and the first dielectric layer 321 on which the second electrode 332 is formed through the insulating adhesive layers.

As described above, the functional elements 330 are implemented on the unit substrates 320 using the large-area substrate 320a such that the functional elements 330 may be easily manufactured and be mass-produced. Further, since the functional element 330 is implemented during the manufacturing process of the substrate 320, a process may be simplified as compared with a case in which the functional element 130 is coupled to a guide.

Figure 13:
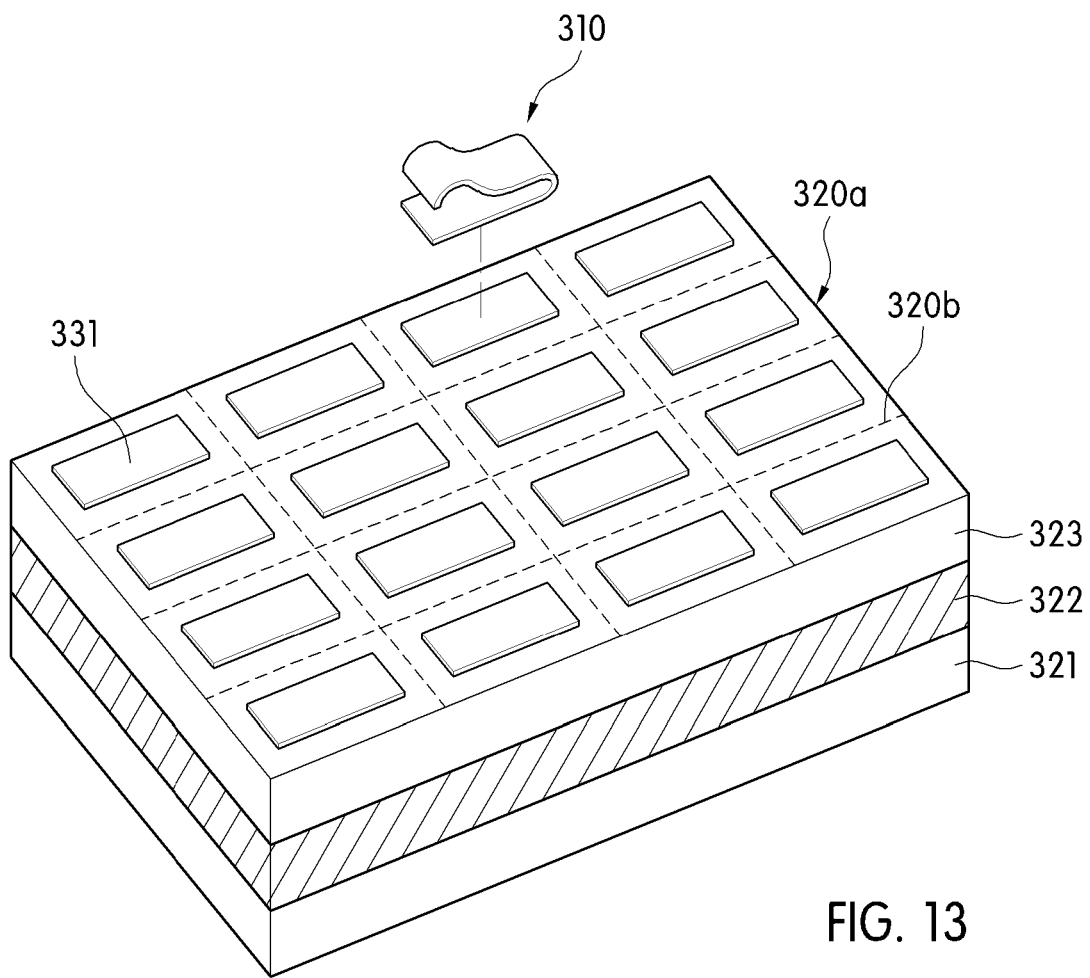
FIG. 13 is a perspective view illustrating an example of a process of soldering a conductive elastic portion during the process of manufacturing the functional contactor according to the second embodiment of the present invention.

As shown in FIGS. 13 and 14, conductive elastic portions 310 may be bonded to the large-area substrate 320a comprised of the plurality of dielectric layers 321, 322, and 323 and provided with functional elements 330 through soldering.

That is, in a state in which a plurality of first electrodes 331 are formed on the upper surface of the large-area substrate 120a provided with the functional elements 330, a plurality of conductive elastic portions 310 are soldered on the first electrodes 331 using solder such that the conductive elastic portions 310, the substrates 320, and the functional elements 330 may be integrally formed (see FIG. 13).

Further, when the first electrode 431 is integrally formed (see FIG. 14), i.e., when the first electrode 431 is formed to be larger than each of the conductive elastic portions 310, since an alignment of the conductive elastic portions 310 may not be easy, a stopper for aligning positions of the conductive elastic portions 310 may be provided on the first electrode 431.

As described above, since the plurality of conductive elastic portions 310 are soldered to the plurality of first electrodes 331 or the first electrode 431 integrally formed on the large-area substrate 320a using solder, an alignment and soldering of the conductive elastic portions 310 may be performed easily and accurately as compared with a conventional individual coupling such that efficiency of a manufacturing process as well as reliability of a product may be improved.

In this case, the large-area substrate 320a is cut along a cutting line 320b having a unit size such that a unit functional contactor 300 or 400 may be manufactured in large quantities.

As described above, since the implementation of the plurality of functional elements 330 and the soldering of the conductive elastic portions 310 may be carried out simultaneously in large quantities using the large-area substrate 320a, mass production of the functional contactor 300 or 400 may be possible.

Although the exemplary embodiments of the present invention have been described, the spirit of the present invention is not limited to the exemplary embodiments disclosed herein, and it should be understood that numerous other embodiments can be devised by those skilled in the art that will fall within the same spirit and scope of this disclosure through addition, modification, deletion, supplement, and the like of a component, and also these other embodiments will fall within the spirit and scope of the present invention.

The invention claimed is:

1. A functional contactor comprising:
   a conductive elastic portion configured to come into electrical contact with one among a circuit substrate of an electronic device, a bracket coupled to the circuit substrate, and a conductor contactable with a human body, wherein the conductive elastic portion has an elastic force;
   a substrate made of a dielectric material and having a groove formed in either an upper surface or a lower surface of the substrate; and
   a functional element including a high dielectric material inserted into the groove and made of sintered ceramic having a dielectric constant that is higher than that of the dielectric material, a first electrode disposed on the upper surface of the substrate and electrically connected to the conductive elastic portion in series, and a second electrode opposite to the first electrode and disposed on the lower surface of the substrate.

2. The functional contactor of claim 1, wherein the high dielectric material is made of a low temperature co-fired ceramic (LTCC) or a varistor material.

3. The functional contactor of claim 2, wherein the varistor material includes a semiconductive material containing one or more of ZnO, $SrTiO_3$, $BaTiO_3$, and SiC, or one of Pr- and Bi-based materials.

4. The functional contactor of claim 1, wherein the dielectric material is made of flame retardant 4 (FR4) or polyimide (PI).

5. A functional contactor comprising:
   a conductive elastic portion configured to come into electrical contact with one among a circuit substrate of an electronic device, a bracket coupled to the circuit substrate, and a conductor contactable with a human body, wherein the conductive elastic portion has an elastic force;
   a substrate comprised of a plurality of dielectric material layers; and
   a functional element including a first electrode electrically connected in series to the conductive elastic portion, and a second electrode disposed to be opposite to the first electrode at a predetermined interval,
   wherein the plurality of dielectric material layers are disposed between the first electrode and the second electrode, a first dielectric material layer, a second dielectric material layer, and a third dielectric material layer are sequentially stacked on the second electrode, and the second dielectric material layer is made of sintered ceramic having a high dielectric constant that is higher than that of each of the first dielectric material layer and the third dielectric material layer.

6. The functional contactor of claim 5, wherein the second dielectric material layer is made of a low temperature co-fired ceramic (LTCC) or a varistor material.

7. The functional contactor of claim 5, wherein each of the first dielectric material layer and the third dielectric material layer is made of flame retardant 4 (FR4) or polyimide (PI).

8. The functional contactor of claim 1, wherein the first electrode and the second electrode are formed on an entirety or part of upper and lower surfaces of the substrate, respectively.

9. The functional contactor of claim 1, wherein the functional element has an electric shock prevention function of blocking a leakage current of an external power source flowing from a ground of a circuit substrate of the electronic device, a communication signal transmission function of passing a communication signal flowed from a conductive case or the circuit substrate, and an electrostatic discharge (ESD) protection function of passing the ESD without a dielectric breakdown when the ESD flows from the conductive case.

10. The functional contactor of claim 1, wherein the conductive elastic portion includes one among a conductive gasket, a silicone rubber pad, and a clip-shaped conductor having an elastic force.

11. The functional contactor of claim 1, wherein the conductive elastic portion is in line-contact or point-contact so as to reduce galvanic corrosion.

12. The functional contactor of claim 5, wherein the first electrode and the second electrode are formed on an entirety or part of upper and lower surfaces of the substrate, respectively.

13. The functional contactor of claim 5, wherein the functional element has an electric shock prevention function of blocking a leakage current of an external power source flowing from a ground of a circuit substrate of the electronic device, a communication signal transmission function of passing a communication signal flowed from a conductive case or the circuit substrate, and an electrostatic discharge (ESD) protection function of passing the ESD without a dielectric breakdown when the ESD flows from the conductive case.

14. The functional contactor of claim 5, wherein the conductive elastic portion includes one among a conductive gasket, a silicone rubber pad, and a clip-shaped conductor having an elastic force.

15. The functional contactor of claim 5, wherein the conductive elastic portion is in line-contact or point-contact so as to reduce galvanic corrosion.

\* \* \* \* \*